United States Patent [19]

Tults

[11] Patent Number: 5,157,492
[45] Date of Patent: Oct. 20, 1992

[54] SYNC VALIDITY DETECTING UTILIZING A MICROCOMPUTER

[75] Inventor: Juri Tults, Indianapolis, Ind.

[73] Assignee: Thomson Consumer Electronics, Inc., Indianapolis, Ind.

[21] Appl. No.: 865,813

[22] Filed: Mar. 31, 1992

Related U.S. Application Data

[63] Continuation of Ser. No. 513,445, Apr. 30, 1990, abandoned.

[51] Int. Cl.[5] .............................................. H04N 5/04
[52] U.S. Cl. .................................... 358/148; 358/153
[58] Field of Search ............... 358/139, 148, 153, 154, 358/149, 155

[56] References Cited

U.S. PATENT DOCUMENTS

| | | | |
|---|---|---|---|
| 4,464,679 | 8/1984 | Wargo | 358/149 |
| 4,654,708 | 3/1987 | de la Guardia et al. | 358/148 |
| 4,729,023 | 3/1988 | Srivastava et al. | 358/155 |

*Primary Examiner*—James J. Groody
*Assistant Examiner*—D. Harvey
*Attorney, Agent, or Firm*—Joseph S. Tripoli; Peter M. Emanuel; Robert D. Shedd

[57] ABSTRACT

A tuning system includes a microcomputer-based synchronization signal detector which does not require the use of a hardware timer/counter. The microcomputer samples the output signal of a sync separator coupled to an ordinary input/output port during a number of different evaluation intervals to determine if respective characteristics of a valid sync signal occur. During one evaluation interval, a test is performed to determine if a "high" level is present for a time duration less than a given time duration (e.g. 10 μS) corresponding to the maximum duration of horizontal sync pulses. During another evaluation interval, a test is performed to determine if a "low" level is present for a time duration greater than another given time duration (e.g., 40 μS) corresponding to the minimum separation between horizontal sync pulses. The sampling intervals and evaluation intervals are established by the time required to execute instruction cycles.

5 Claims, 2 Drawing Sheets

SYNC VALIDITY DETECTING UTILIZING A MICROCOMPUTER

This is a continuation of application Ser. No. 513,445, filed Apr. 30, 1990, now abandoned.

FIELD OF THE INVENTION

The present invention concerns a method and apparatus, utilizing a microcomputer, for determining when a synchronization component of a video signal is correct.

BACKGROUND

Tuning systems which are capable of tuning of television signals with non-standard carrier frequencies, as well as with standard (i.e., "broadcast") carrier frequencies, include provisions for changing the frequency of the local oscillator signal in order to search a range of frequencies and provisions for detecting when proper tuning has been achieved. The latter provisions usually include apparatus for examining an automatic fine tuning (AFT) signal representing the frequency relationship between the IF signal and a nominal value, and also apparatus for determining whether or not the demodulated signal produced by the video detector contains picture synchronization ("sync") information. The test for synchronization information is performed as a verification that the RF carrier which has been found during the search is a picture carrier and not a sound carrier because the AFT signal may exhibit conditions corresponding to proper tuning in response to either a picture or a sound carrier. Such a tuning system is described in U.S. Pat. No. 4,868,892 issued to J. Tults et al. on Sep. 19, 1989.

A hardware implementation, i.e., one using dedicated logic elements, of a so-called "sync presence" detector for evaluating the output signal of a synchronization (sync) signal separator of the television receiver in order to determine whether valid picture synchronization information is present is disclosed in U.S. Pat. No. 4,364,094 issued to J. Tults on Dec. 14, 1982.

In a modern television receiver, most control functions, including tuning, are performed by a microcomputer ($\mu C$). It is therefore desirable to use the $\mu C$ for sync presence detection also.

Most $\mu Cs$ include a hardware counter for performing various timer and/or counter functions. If it is possible to couple the output signal of a sync separator to the timer/counter of the $\mu C$ through an input port, a simple method for detecting presence of sync information utilizing the $\mu C$ is to enable the time/counter to count transitions of the output signal of the sync separator during a predetermined time interval. If the count reaches a predetermined number, an indication of a valid sync component is generated.

The technique described above requires a $\mu C$ with an "on-board" timer/counter which is externally accessible.

Even if a $\mu C$ includes an externally accessible timer/counter, it is usually desirable to employ the timer/counter to perform other important functions, such as time keeping and decoding of remote control IR commands, which should not be interrupted.

Another problem associated with the use of a hardware counter/timer of a $\mu C$ is that a seemingly correct result may be obtained under the wrong circumstances, e.g., when the output signal of the sync separator includes randomly spaced noise pulses.

SUMMARY OF THE INVENTION

The present invention, in part, concerns a software controlled "sync presence" detector which does not require a hardware timer counter. Accordingly, if a timer/counter is available in a $\mu C$, it may be used for other purposes. In accordance with one aspect of the invention, the output signal of the sync separator is coupled to an ordinary, general purpose input port of the $\mu C$ and is asynchronously sampled at sampling intervals during a number of evaluation intervals. The sampling intervals and the evaluation intervals are each established by the time required to execute a respective set of instructions, rather than by a hardware timer. During each evaluation interval, it is determined whether or not the output signal of the sync separator has a respective characteristic of a valid sync signal. According to another aspect of the invention, a predetermined number of sequences of positive results during respective evaluation intervals must be produced before an indication of a valid sync signal is provided.

BRIEF DESCRIPTION OF THE DRAWING

The preferred embodiment of the invention will be described with reference to the accompanying Drawing in which.

Figure 2:
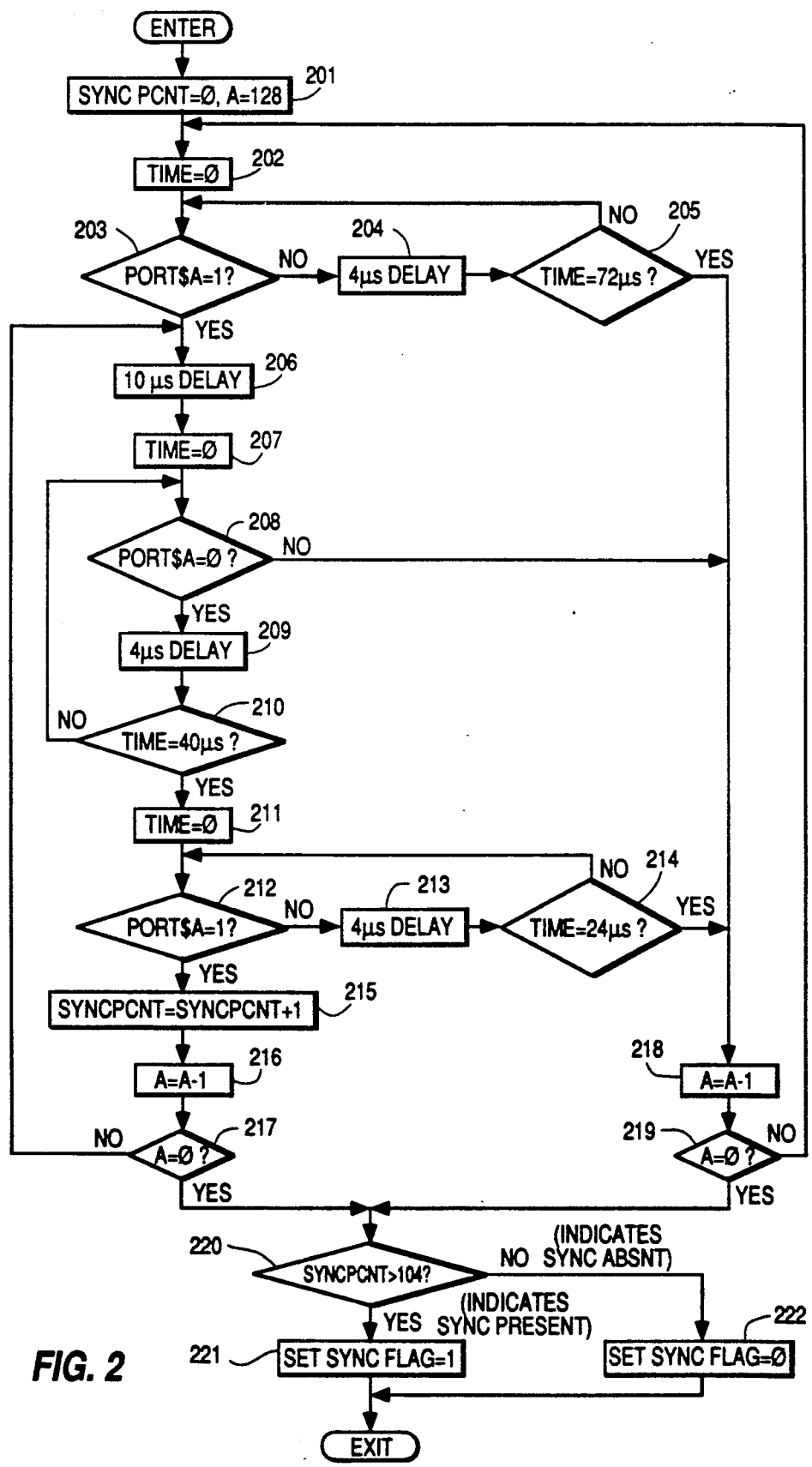
FIG. 2 shows a flow chart of the portion of the control program of the microcomputer of the tuning system shown in FIG. 1 which is concerned with "sync presence" detection.

The accompanying Addendum contains a program listing corresponding to the flow chart shown in FIG. 2.

DESCRIPTION OF THE PREFERRED EMBODIMENT

Figure 1:
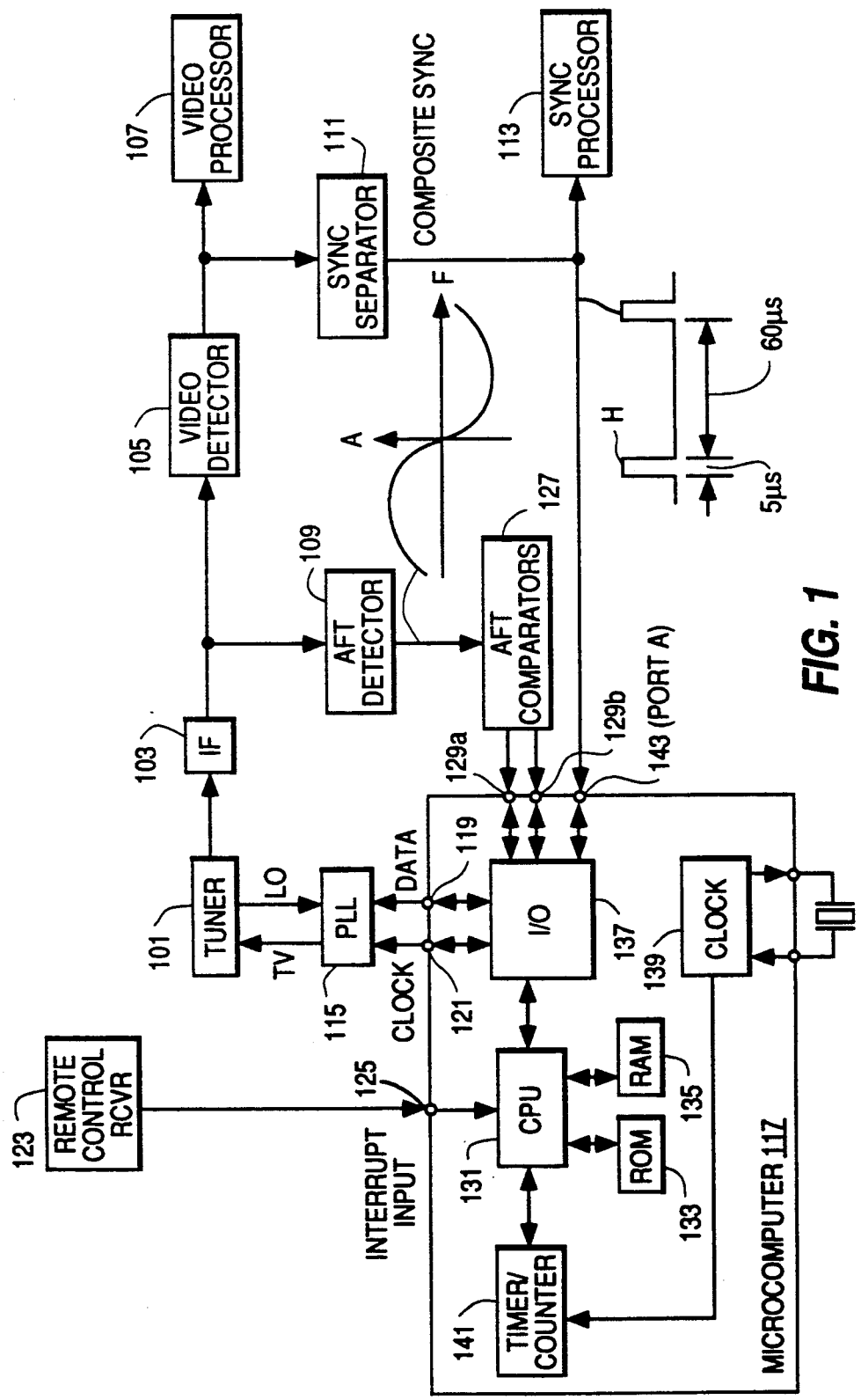
FIG. 1 shows a block diagram of a television receiver including a tuning system utilizing a microcomputer-based "sync presence detector" constructed and operating in accordance with respective aspects of the present invention.

The television receiver shown in FIG. 1, includes a tuner 101, an IF section 103, a video detector 105, a video processing section 107, an AFT detector 109, a sync separator 111 and a sync processing section 113 arranged in conventional fashion. When a channel is properly tuned sync separator 111 produces a composite sync signal containing both horizontal and vertical sync pulses.

Tuner 101 includes a local oscillator (not shown) which is part of and controlled by a phase locked loop (PLL) 115. Phase locked loop 115 generates a tuning voltage (TV) in response to an error signal produced by comparing the frequency (and phase) of a signal derived by dividing the frequency of the local oscillator (LO) signal by a controllable division factor N to a reference frequency signal. Division factor N is controlled by a microcomputer ($\mu C$) 117, which also controls various other functions of the television receiver. In the illustrative embodiment, data for controlling division factor N is coupled to PLL 115 from an input/output port (terminal) 119 of $\mu C$ 117 in serial fashion. A clock signal, used to decode the serial data, is coupled to PLL 115 from an input/output port 121 of $\mu C$ 117.

A user may control various functions of the television receiver, including channel selection, by using a remote control system. Only remote control receiver 123 of the remote control system is shown in FIG. 1. Remote control receiver 123 is coupled to a so-called "interrupt" input terminal 125 of μC 117.

Microcomputer 117 controls division factor N of PLL 115 in accordance with a channel selection made by a user. In order to tune RF television signals with non-standard frequency carriers, as well as with standard frequency carriers, μC 117 also controls division factor N in accordance with the condition of the automatic fine tuning (AFT) signal generated by AFT detector 109 and the condition of the output signal of sync separator 111.

Specifically, in order to locate and tune RF signals with non-standard frequency carriers, μC 117 controls division factor N so that the local oscillator frequency is changed in relatively small steps in a search range surrounding the nominal local oscillator frequency for a selected channel. As is shown in FIG. 1, the AFT signal has a generally S-shaped amplitude versus frequency characteristic, having positive and negative amplitude regions or "humps" on opposite sides of a nominal frequency value. Threshold comparators within a AFT comparator section 127 determine when the amplitude of the AFT signal is within respective ones of the two amplitude regions. The output signals of the threshold comparators of AFT comparator section 127 are coupled to input/output ports 129a and 129b of μC 117. The presence of a carrier is indicated when the amplitude of the AFT signal is in the positive amplitude region for one step and then the negative amplitude region for the next step (assuming that the local oscillator frequency is being increased).

Unfortunately, AFT detector 109 may respond in the same way to both picture and sound carriers and tuning errors may occur if sole reliance is placed on the AFT signal. Therefore, the output signal of sync separator 111 is examined to determine whether or not it contains a valid horizontal sync component. A valid sync signal indicates that a picture carrier rather than a sound carrier has been located.

The tuning system described so far is similar to that disclosed in U.S. Pat. No. 4,868,892 issued to J. Tults referred to above. However, the present tuning system differs from the tuning system disclosed in the patent in that the output of sync separator 111 is directly evaluated by μC 117 using a software controlled algorithm rather than by dedicated logic.

Before describing the software algorithm with reference to the flow chart shown in FIG. 2, the basic components of μC 117 will be briefly described so as to better understand the algorithm and certain of its advantages.

Microcomputer 117 includes a central processing unit (CPU) 131 which communicates with a read only memory (ROM) 133 and a random access memory (RAM) 135. Central processing unit 131 processes data stored in RAM 135 in accordance with a set of instructions (i.e., a "program") stored in ROM 133. Data is coupled between CPU 131 and various input/output ports (terminals) through an input/output (I/O) unit 137. A crystal control clock generator 139 provides various clocking and timing signals for various portions of μC 117.

As earlier noted, μC 117 has an "interrupt" input terminal 125. When an interrupt signal, e.g., a positive-going pulse, is received at interrupt input terminal 125, CPU 131 immediately interrupts the execution of the main control program and initiates the operation of an "interrupt" program. This operation will be described later by way of example with reference to the decoding of remote control signals coupled to "interrupt" input 125 from remote control receiver 123.

Microcomputer 117 also includes a so-called hardware "timer/counter" 141 coupled to CPU 131. In the exemplary embodiment, timer/counter 141 continuously receives and counts clock pulses of a clock signal generated by clock generator 139. Timer/counter 141 is useful for various timer/counter functions.

By way of example, timer/counter 141 may be used to measure the duration of a portion of a pulse signal by loading an initial count value in to it at the occurrence of a first transition of the pulse signal, determining a final count value at the occurrence of a second transition of the pulse signal and subtracting the two count values. In the present embodiment, the time durations between the pulses of the remote control signal are measured using timer/counter 141 and interrupt input 125 in order to decode the remote control signal. Specifically, when a first remote control pulse is received at "interrupt" input 125, the interrupt program is initiated and causes an initial value to be loaded into timer/counter 141. When a second remote control pulse is received, a final count value reached by timer/counter 141 is determined by CPU 131. The two count values are subtracted from initial value to determine the time duration between the remote control pulses. By way of example, a long duration may correspond to a logic "1" and a short duration may correspond to a logic "0".

In the present embodiment, timer/counter 141 is also used to keep the present time. Each time a maximum count of timer/counter 141 is reached, a count representing the present time stored in the register of RAM 135 is increased.

Timer/counter 141 may also be used to evaluate the output signal of sync separator 111, e.g., by measuring the time interval between positive- or negative-going transitions as previously described. However, in the present embodiment, timer/counter 141 and interrupt input 125 is already being used to decode remote control signals. In addition, the use of timer/counter 141 to evaluate the output signal of sync separator 111 is restricted to a relatively simple time duration measurement which is subject to errors.

In the preferred embodiment of the invention, the output of sync separator 111 is evaluated using a software algorithm, rather than hardware timer/counter 141. In addition to leaving the timer/counter free for other functions, the algorithm allows the output signal of sync separator 111 to be coupled to an ordinary general purpose input/output port (terminal) 143 of μC 117. In the flow chart shown in FIG. 2, input/output port 143 is referred to as port A.

A detailed flow chart of the portion of the control program of microcomputer 117 concerned with the determination of whether or not valid sync information present is shown in FIG. 2. The corresponding program "listing" and the identification of certain performance characteristics is contained in the accompanying Addendum. The code indicated in the listing is that of a so-called "TELEKAT" television control IC, including a 6805 based microcomputer, available from Motorola Semiconductor Products, Inc. The "TELEKAT" IC also includes a tuner control phase locked loop as well as digital to analog converters for various television control functions, such as brightness, contrast, saturation, color and volume. It also includes a character generator for producing character signals suitable for an "on-screen" display of information such as the channel numbers of presently tuned channels.

Basically, as indicated above, the sync presence algorithm determines whether or not a predetermined number of horizontal sync pulses of approximately the correct time duration (about 5 µS) and approximately correct period (about 64 µS) occur for a given number of test cycles. During each test interval, the software program of µC 117 "looks" for a positive sync pulse at port A at intervals of 4 µS (microseconds). Sampling at this rate is desirable because normal horizontal sync pulses may have a minimum duration of 4 µS. After detection of a sync pulse, the program continues sampling the input to make sure that the next pulse occurs approximately 60 µS later, as expected.

Several variables stored in RAM 135 of µC 117 are used in the sync presence detection algorithm indicated in FIG. 2:

"A" is a count of how many test cycles for a valid horizontal sync pulse have occurred. 128 test cycles are executed. The number 128 was chosen because it corresponds to approximately one-half of a television field and is long enough to allow for errors due to the double frequency pulses which occur during the vertical blanking interval.

"SYNCPCNT" is a count of how many times a valid horizontal sync pulse has been found to exist. A SYNCPCNT count greater than 104 indicates the presence of correct sync information. The number 104 is chosen since it allows for some incorrect results out of the 128 test cycles. Certain expected incorrect results are due to the double frequency narrow equalizing pulses and wide vertical sync pulses contained within the vertical blanking interval.

The sampling intervals, evaluation intervals and delays utilized in the sync detection program are established by the time required to execute instructions (such as DECX indicated in the listing), rather than by the use of timer/counter 141. More specifically, referring to the listing, the small loops shown in the flow chart are identical in terms of execution time. The BRSET instruction examines the logic level of the output signal of sync separator 111 and is executed in 2.5 µS. The DECX and BNE instructions are used alternately between the BRSET instructions and are both executed in 1.5 µS. As a result, the execution time of one loop is 8 µS and the output signal of sync separator 111 is examined twice at 4 µS intervals in each loop. The instruction DECX causes the contents of a register (X) in RAM 135 to be decreased by 1. The instruction BNE checks whether or not the contents of the X register has reached 0 to determine whether or not an alloted time interval has elapsed. However, for the sake of indicating functional operations in a relatively simple manner, variables such as TIME and DELAY are represented in the flow chart as if they were established by a conventional timer/counter.

In the flow chart, the instruction "PORT$A" causes the output signal of sync separator 111 coupled to port A to be sampled. Port A and the instruction PORT$A should not be confused with variable "A".

In the following description of the sync detection algorithm, reference numbers of blocks of the flow chart shown in FIG. 2 are indicated, where appropriate.

The sync detection algorithm is initiated ("entered") after the presence of a carrier has been detected by examining the AFT signal during the search operation previously described.

After the sync presence portion of the program is entered, SYNCPCNT is set to a count of 0 and A is set to a count of 128 (201). Thereafter, TIME is set to 0 (202) and port A is sampled every 4 µS until the output signal of sync separator 111 is "high" (a logic "1"), or until a period of 72 µS has elapsed (203, 204, 205). The time interval of 72 µS provides a default or "escape" condition to prevent "lockup" in case a valid sync signal is not present at port A. If a logic "1" has appeared at port A, port A is again sampled after a delay of 10 µS to determine if a logic "0" is present (206, 208). Steps 203, 204, 205, 206 and 208 are used to determine if a "high" pulse no longer in duration than 10 µS is developed at the output of sync separator 111. A positive (YES) result at step 208 indicates the possible presence of a horizontal sync pulse.

If the result was positive (YES) at step 208, port A continues to be sampled every 4 µS until a period of 4 µS has elapsed, or until a logic "1" appears at the output of sync separator 111 (208, 209, 210). The timer is initialized for this evaluation at step 207. Steps 208, 209 and 210 are used to determine if the output signal of sync separator 111 is "low" for a period somewhat shorter than the time interval between horizontal sync pulses.

If a 40 µS "low" period has been found to exist (208, 209, 210), port A is again sampled at 4 µS intervals until a "high" is detected, or until 24 µS have elapsed (211, 212, 213, 214). Steps 211, 212, 213, and 214 are used to determine if another horizontal sync pulse occurs after the 40 µS "low" period. The 24 µS time interval provides a default condition.

If two successive "high" periods, corresponding to horizontal sync pulses, separated by at least a 40 µS low period, have occurred (YES at 212), the SYNCPCNT count is increased by 1 (216) and the A count is decreased by 1 (215). At this point, if A has not reached 0 (NO at 217), the program returns to step 206 to examine the next interval between pulses.

If any condition indicating an improper sync component is detected during an evaluation cycle (202-214), A is also decreased by 1 but SYNCPCNT is not increased by 1 (218). A failure is indicated when either: (1) no "high" has appeared in 72 µS (203, 204, 205); (2) a "high" was longer than 10 µS (206, 208) (3) a 40 µS "low" has not appeared (208, 209, 210); or (4) a second "high" has not appeared within 24 µS (212, 213, 214). At this point, if A has not reached 0 (NO at 219), another evaluation cycle is initiated (202) to look for a horizontal sync pulse.

If A reaches a count of 0 at either step 217 or 219, indicating that 128 complete evaluations have been performed, SYNCPCNT is evaluated (220). If SYNCPCNT is greater than 104, a flag register indicating the presence of a valid sync component is set to a logic "1" (221). Thereafter, the sync presence algorithm is "exited" and the tuning algorithm continues by changing the local oscillator frequency in very small steps until the AFT signal is between its two humps in order to "fine tune" the local oscillator. Alternatively, if SYNCPCNT is not greater than 104, the flag register is set to a logic "0" to indicate that a valid sync component is not present (222). Thereafter, the tuning algorithm continues the search for a picture carrier.

It will be appreciated by those skilled in the art that while the term "microcomputer" has been used in describing the embodiment of the invention, the term "microprocessor", at least in connection with the present invention is synonymous, with microcomputer.

The total time of execution of the sync detection portion of the program is about 8 ms (milliseconds). A reasonable number of program interruptions for such functions as checking for user generated commands and controlling various television functions does not significantly affect the performance of the sync detection program. Every interrupt may simply reduce the number of detected sync pulses by a very small number. This can be easily accounted for by reducing the threshold value of the expected sync pulse count (SYNPCNT).

The present invention has been described by way of example in terms of the sync component conforming to the NTSC television signal standard utilized in the United States. However, it will be appreciated by those skilled in the art, that with the teaching provided by exemplary embodiment, the invention may be applied to sync components conforming to other television signal standards, such as PAL and SECAM.

While the present sync presence detector described with reference to a tuning system in which the presence of sync is used to confirm that a picture carrier rather than a sound carrier has been tuned after an AFT signal initially indicates the presence of a carrier, it will be appreciated that the sync presence detector may be utilized without an AFT detector, e.g., to indicate the presence of television signals. These and other modifications are intended to be within the scope of the present invention defined by the following claims.

I claim:

1. Apparatus for evaluating a synchronization component of a television signal, comprising:
    a microcomputer including a central processing unit; a plurality of interface ports; and means for coupling said ports to said processing unit;
    memory means for storing a program of instructions to control said microcomputer coupled to said central processing unit of said microcomputer; and
    means receiving said television signal at an input for developing said synchronization component at an output; said output being coupled to one of said interface ports;
    said control program including a portion 1) for causing during each of a first predetermined number of evaluation intervals said microcomputer to repetitively sample the signal developed at said output of said developing means to determine whether or not the samples of said signal developed at said output correspond to the same amplitude profile representative of a portion of a correct synchronization component, and 2) for causing said microcomputer after said first predetermined number of evaluation intervals to determine whether or not said amplitude profile was produced during at least a second predetermined number of said evaluation intervals, where said second predetermined number is less than said first predetermined number.

2. The apparatus recited in claim 1, wherein:

---

APPENDUM

```
1                      ; TEST PROGRAM FOR SYNC DETECTOR
2                      ;
3                      ;THIS PROGRAM MAXIMIZES THE SAMPLING OF SYNC SIGNAL THROUGHOUT THE 64us
4                      ;PERIOD OF A COMPLETE CYCLE. THE SAMPLING INTERVAL IS 4.0us, BASED ON
5                      ;A MACHINE CYCLE OF .5us FOR THE 6805 CORE OF THE TELEKAT IC.
6                      ;
7                      ;PERFORMANCE CHARACTERISTICS FOR "VALID SAMPLE COUNT">64 :
8                      ;    RF CARRIER LEVEL > -95dBa (12uv)
9                      ;    SYNC PULSE WIDTH 2.7us MIN., 12us MAX.
10                     ;    SYNC PULSE FREQUENCY 13.9KHz MIN., 19.8KHz MAX.
11                     ;
43                     ;--------------------MAIN PROGRAM--------------------
44  201B  3F 72  START    CLR    SYNCPCNT         ;CLEAR VALID SAMPLE COUNTER
45  201D  A6 80           LDA    #128             ;INITALIZE ACC. AS LOOP COUNTER TO 128
46  201F  AE 09  FINDHI   LDX    #9
47  2021  02 00 08 FINDHIR BRSET  1,PORT$A,SIGHIGH ;LOOK FOR HIGH SIGNAL LEVEL AT 4us
48  2024  5A             DECX                     ;  INTERVALS UP TO 18 TIMES
49  2025  02 00 04        BRSET  1,PORT$A,SIGHIGH
50  2028  26 F7           BNE    FINDHIR
51  202A  20 1B           BRA    ENDLOOP
52  202C  AE 02  SIGHIGH  LDX    #2
53  202E  5A     DONTCR   DECX                    ;UPON DETECTION OF HIGH SIGNAL LEVEL WAIT
54  202F  26 FD           BNE    DONTCR           ;  ABOUT 10us TO ALLOW FOR NEG. TRANSITION
55  2031  AE 05  GAP      LDX    #5
56  2033  02 00 11 GAPR   BRSET  1,PORT$A,ENDLOOP ;REQUIRE GAP BETWEEN PULSES TO BE AT LEAST
57  2036  5A             DECX                     ;  ABOUT 40us WIDE        WHILE SAMPLING
58  2037  02 00 0D        BRSET  1,PORT$A,ENDLOOP ;  THE SIGNAL AT 4us INTERVALS
59  203A  26 F7           BNE    GAPR
60  203C  AE 03           LDX    #3
61  203E  02 00 0B GAPEXT BRSET  1,PORT$A,VALIDS  ;LOOK FOR NEXT POS. TRANSITION WITHIN THE
62  2041  5A             DECX                     ;  NEXT 24us BY SAMPLING AT 4us INTERVALS
63  2042  02 00 07        BRSET  1,PORT$A,VALIDS
64  2045  26 F7           BNE    GAPEXT
65  2047  4A     END-     DECA                    ;IF NOT FOUND, DECREMENT LOOP COUNTER
66  2048  26 D5  LOOP     BNE    FINDHI           ;  AND RESTART LOOKING FOR HIGH SIGNAL
67  204A  20 05           BRA    FINISH           LEVEL
68  204C  3C 72  VALIDS   INC    SYNCPCNT         ;IF SUCCESFUL, INCR. VALID SAMPLE COUNTER,
69  204E  4A             DECA                     ;  DECREMENT LOOP COUNTER AND START
70  204F  26 E0           BNE    GAP              ;  MEASURING GAP BETWEEN PULSES
71                     ;----------UPDATE MINIMUM AND MAXIMUM COUNT MEMORIES----------
72  2051  B6 72  FINISH   LDA    SYNCPCNT
73  2053  B0 71           SUB    MINCNT           ;CHECK WHETHER MIN. VALID SAMPLE COUNT
                          RTS                     ;EXIT SUBROUTINE WITH RESULT IN ACC.
``` said sampling intervals and said evaluation intervals are established by the time required to execute respective instructions in said program.

3. The apparatus recited in claim 2, wherein:

said output signal is sampled during one of said evaluation intervals to determine if said output signal has a first level for a time duration no greater than a given time duration related to the maximum time duration of horizontal synchronization pulses;

said output signal is sampled during another one of said evaluation intervals to determine if said output signal has a second level, different from said first level, for a time duration greater than another given time duration related to the minimum time duration between horizontal synchronization pulses.

4. Apparatus for evaluating a synchronization component of a television signal, comprising:

a microcomputer including a central processing unit; a plurality of interface ports; and means for coupling said ports to said processing unit;

memory means for storing a program of instructions to control said microcomputer coupled to said central processing unit of said microcomputer; and means receiving said television signal at an input for developing said synchronization component at an output; said output being coupled to one of said interface ports;

said control program including a portion causing said microcomputer to sample said synchronization component asynchronously with respect to a correct synchronization component during a plurality of evaluation intervals in which said asynchronous samples of said output signal are evaluated by said microcomputer to determine whether or not said asynchronous samples correpond to respective intervals of said correct synchronization component;

sampling intervals and said evaluation intervals are established by the time required to execute respective instructions in said program;

said output signal is sampled during one of said evaluation intervals to determine if said output signal has a first level for a time duration no greater than a given time duration related to the maximum time duration of horizontal synchronization pulses;

said output signal is sampled during another one of said evaluation intervals to determine if said output signal has a second level, different from said first level, for a time duration greater than another given time duration related to the minimum time duration between horizontal synchronization pulses;

said evaluation intervals are repeated in a given sequence for a first predetermined number of cycles through said given sequence;

a count variable is increased after each cycle if a positive determination is made in each evaluation interval of a cycle; and an indication that said output signal corresponds to said synchronization component is generated if said count variable is greater than a second predetermined number after said first predetermined number of cycles has occurred, said second predetermined number being less than said first predetermined number.

5. The apparatus recited in claim 1, wherein:

said interface ports of said microcomputer are general purpose interface ports.

* * * * *